United States Patent
Bilodeau et al.

(10) Patent No.: US 10,991,809 B2
(45) Date of Patent: Apr. 27, 2021

(54) COMPOSITION AND PROCESS FOR SELECTIVELY ETCHING P-DOPED POLYSILICON RELATIVE TO SILICON NITRIDE

(71) Applicant: ENTEGRIS, Inc., Billerica, MA (US)

(72) Inventors: Steven Bilodeau, Billerica, MA (US); Emanuel I Cooper, Billerica, MA (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 15/777,837

(22) PCT Filed: Nov. 22, 2016

(86) PCT No.: PCT/US2016/063323
§ 371 (c)(1),
(2) Date: May 21, 2018

(87) PCT Pub. No.: WO2017/091572
PCT Pub. Date: Jun. 1, 2017

(65) Prior Publication Data
US 2018/0337253 A1     Nov. 22, 2018

Related U.S. Application Data

(60) Provisional application No. 62/353,228, filed on Jun. 22, 2016, provisional application No. 62/288,809, filed on Jan. 29, 2016, provisional application No. 62/258,735, filed on Nov. 23, 2015.

(51) Int. Cl.
| | | |
|---|---|---|
| *C09K 13/08* | (2006.01) | |
| *H01L 21/02* | (2006.01) | |
| *H01L 21/04* | (2006.01) | |
| *H01L 21/225* | (2006.01) | |
| *H01L 21/306* | (2006.01) | |
| *H01L 21/311* | (2006.01) | |
| *H01L 21/3213* | (2006.01) | |
| *H01L 29/49* | (2006.01) | |
| *H01L 29/51* | (2006.01) | |
| *H01L 29/66* | (2006.01) | |

(52) U.S. Cl.
CPC ........ *H01L 29/66545* (2013.01); *C09K 13/08* (2013.01); *H01L 21/306* (2013.01); *H01L 21/30604* (2013.01); *H01L 21/311* (2013.01); *H01L 21/31105* (2013.01); *H01L 21/31111* (2013.01); *H01L 21/32134* (2013.01); *H01L 29/4966* (2013.01); *H01L 29/517* (2013.01)

(58) Field of Classification Search
None
See application file for complete search history.

(56) References Cited

U.S. PATENT DOCUMENTS

| | | | | |
|---|---|---|---|---|
| 5,998,246 A | * | 12/1999 | Huang | H01L 29/66613 257/E21.414 |
| 6,316,370 B1 | * | 11/2001 | Mercaldi | H01L 21/32134 252/79.1 |
| 2002/0072235 A1 | | 6/2002 | Haga | |
| 2002/0137284 A1 | | 9/2002 | Chang et al. | |
| 2007/0175862 A1 | * | 8/2007 | Yamada | B81C 1/00595 216/83 |
| 2011/0059570 A1 | | 3/2011 | Kuebelbeck | |
| 2011/0101298 A1 | | 5/2011 | Tang et al. | |
| 2012/0267627 A1 | * | 10/2012 | Barr | C09K 13/08 257/49 |
| 2013/0043515 A1 | | 2/2013 | Huang et al. | |
| 2013/0102158 A1 | * | 4/2013 | Detterbeck | C09K 13/08 438/748 |
| 2013/0137277 A1 | * | 5/2013 | Huang | H01L 21/32134 438/753 |
| 2015/0170920 A1 | | 6/2015 | Purayath et al. | |

FOREIGN PATENT DOCUMENTS

| | | |
|---|---|---|
| JP | 2006319171 A | 11/2006 |
| JP | 2014225633 A | 12/2014 |
| JP | 2014232829 A | 12/2014 |
| KR | 20010112401 A | 12/2001 |
| WO | 2005-067034 | 7/2005 |
| WO | 2012174518 A2 | 12/2012 |
| WO | 2013031951 A1 | 3/2013 |

* cited by examiner

*Primary Examiner* — Stephanie P Duclair
(74) *Attorney, Agent, or Firm* — Entegris, Inc.

(57) ABSTRACT

A removal composition and process for selectively removing p-doped polysilicon (e.g., boron-doped polysilicon) relative to silicon nitride from a microelectronic device having said material thereon. The substrate preferably comprises a high-k/metal gate integration scheme.

17 Claims, No Drawings

//cover page of patent, first column text
COMPOSITION AND PROCESS FOR SELECTIVELY ETCHING P-DOPED POLYSILICON RELATIVE TO SILICON NITRIDE

CROSS-REFERENCE TO RELATED APPLICATIONS

This application is filed under the provisions of 35 U.S.C. § 371 claiming priority of International Patent Application No. PCT/US2016/063323 filed on Nov. 22, 2016, which further claims the benefit under 35 USC 119 of U.S. Provisional Patent Application No. 62/258,735, filed Nov. 23, 2015, U.S. Provisional Patent Application No. 62/288,809, filed Jan. 29, 2016, and U.S. Provisional Patent Application No. 62/353,228, filed Jun. 22, 2016, the disclosures of which are hereby incorporated herein by reference in their entirety for all purposes.

FIELD

The present invention relates to compositions and methods for selectively removing p-doped polysilicon relative to silicon nitride from a substrate comprising the same. The substrate preferably comprises a high-k/metal gate integration scheme.

DESCRIPTION OF THE RELATED ART

Conventional semiconductor devices can include large numbers of metal oxide semiconductor field effect transistors ("MOSFET"), each comprising at least one source, drain and gate region. Complementary metal-oxide-semiconductors ("CMOS") use complementary and symmetrical pairs of p-type and n-type MOSFETs, allowing for a higher density of logic functions on a chip.

The gate region of MOS or CMOS transistors is generally made of a gate material (e.g., polysilicon) placed over or on top of an oxide insulator/dielectric (e.g., $SiO_2$), which in turn overlies or is on top of a semiconductor material, a combination that is commonly referred to as a "gate stack." Despite the reference to "metal" in metal gate and metal oxide semiconductors, polysilicon is the most common gate material in conventional gate fabrication. Polysilicon has been a preferred material in the fabrication of gate electrodes due to the ease with which it is deposited, its tolerance to extremely high temperatures (in excess of 900-1000° C.) in subsequent manufacturing steps (e.g., annealing), and its ability to form self-aligned gates. Gate fabrication with metals suffers from many of the problems that polysilicon avoids.

The gate dielectric of choice in the prior art has long been silicon dioxide. As transistors have decreased in size, the thickness of the silicon dioxide dielectric has also been scaled down to improve gate capacitance, thereby enhancing current and device performance. The reduction in silicon dioxide gate thickness below approximately 2 nm has resulted in drastically increased leakage currents due to tunneling, which leads to unwieldy power consumption and reduced device reliability. The solution has been to replace the silicon dioxide gate dielectric with a high-k dielectric material that will allow an increased gate capacitance without the concomitant leakage effects. Replacing the silicon dioxide gate dielectric with another material, however, has been found to complicate the manufacturing process.

Due to compatibility issues between standard polysilicon gates and high-k gate dielectrics, the high-k gate dielectrics are more advantageously paired with metal gate electrodes (e.g., TiN for p-type gates; TiAlN for n-type gates). Metal gates, however, pose a number of additional challenges in semiconductor fabrication, including a tendency to disperse into silicon and/or migrate towards mid-gap work functions during high-temperature thermal annealing. It is important for metal incorporated into semiconductor wafers not to be exposed to high temperatures. One proposed solution is utilization of a gate-last process strategy (also known as "replacement gate," "dummy poly-gate," or "cold flow process"), in which the metal electrode is deposited after the high temperature activation anneal(s). In the gate-last process, a polysilicon dummy gate is patterned in the traditional self-aligned process. Once the remaining processing steps are completed, the dummy gate is removed to expose a recess, and a metal is deposited in its place. The recess may be filled with a metal using PVD ("physical vapor deposition"), CVD ("chemical vapor deposition"), or ALD ("atomic layer deposition"). The removal of the dummy gate by traditional methods, however, poses difficulties that are unique to the gate-last process.

Traditional semiconductor etching methods, wet and dry, are not selective and will attack not only the sacrificial polysilicon dummy gate, but other exposed films as well, e.g., silicon nitride. Strong bases will attack silicon dioxide, oxidants will attack TiN, and many HF-containing (or generating) reagents will attack all layers.

Further, among p-type and n-type polysilicon transistors, p-doped polysilicon is much harder to etch. Ammonium hydroxide etching is commonly used for removal of n-type polysilicon. The removal of p-type polysilicon is conventionally carried out by wet etching using tetramethylammonium hydroxide, but the etch rates tend to be low because of p-type, e.g., boron, doping. Further, it is known that nitric acid/HF/water compositions can etch undoped polysilicon, but only at high nitric acid concentrations. Accordingly, because of the high nitrogen content, the solutions have nitric acid (high concentration)/HF/water are not favored. Moreover, it is unknown how effective these nitric acid (high concentration)/HF/water compositions are at etching p-doped polysilicon, e.g., boron-doped polysilicon, much less the compatibility of these compositions for silicon nitride.

In consequence, the art continues to seek improvements in methods of fabricating semiconductor devices involving dummy poly-gate techniques, specifically p-doped polysilicon devices.

SUMMARY OF THE INVENTION

Embodiments of the invention generally relate to compositions and methods for removing p-doped polysilicon relative to silicon nitride from a substrate comprising the same. The substrate preferably comprises a high-k/metal gate integration scheme.

In one aspect, a method of selectively removing p-doped polysilicon relative to silicon nitride from a substrate comprising same is described, said method comprising contacting a substrate comprising p-doped polysilicon and silicon nitride from a substrate with a removal composition, wherein the removal composition selectively removes p-doped polysilicon relative to silicon nitride. In one embodiment, the p-doped polysilicon is boron-doped polysilicon.

In another aspect, a method of selectively removing p-doped polysilicon relative to silicon nitride from a substrate comprising same is described, said method comprising contacting a substrate comprising p-doped polysilicon and silicon nitride with a removal composition, wherein the removal composition selectively removes p-doped polysilicon relative to silicon nitride, and wherein the removal composition comprises at least one nitrate, at least one fluoride, at least one strong acid, optionally at least one silicon source or at least one reducing agent, and optionally at least one solvent. In one embodiment, the p-doped polysilicon is boron-doped polysilicon.

Other aspects, features and advantages of the invention will be more fully apparent from the ensuing disclosure and appended claims.

DETAILED DESCRIPTION, AND PREFERRED EMBODIMENTS THEREOF

Embodiments of the invention generally relate to compositions and methods for selectively removing p-doped polysilicon relative to silicon nitride from a substrate comprising the same. More specifically, embodiments of the invention generally relate to compositions and a wet-based method for removing p-doped polysilicon, e.g., boron-doped polysilicon, relative to silicon nitride from a substrate comprising same, wherein the composition and method do not substantially remove other gate stack materials present on the substrate.

For ease of reference, "microelectronic device" corresponds to semiconductor substrates, flat panel displays, phase change memory devices, solar panels and other products including solar cell devices, photovoltaics, and microelectromechanical systems (MEMS), manufactured for use in microelectronic, integrated circuit, energy collection, or computer chip applications. It is to be understood that the terms "microelectronic device," "microelectronic substrate" and "microelectronic device structure" are not meant to be limiting in any way and include any substrate or structure that will eventually become a microelectronic device or microelectronic assembly. The microelectronic device can be patterned, blanketed, a control and/or a test device.

As defined herein, "metal gate material" corresponds to materials having a Fermi level corresponding to the mid-gap of the semiconductor substrate such as Ti, Ta, W, Mo, Ru, Al, La, titanium nitride, tantalum nitride, tantalum carbide, titanium carbide, molybdenum nitride, tungsten nitride, ruthenium (IV) oxide, tantalum silicon nitride, titanium silicon nitride, tantalum carbon nitride, titanium carbon nitride, titanium aluminide, tantalum aluminide, titanium aluminum nitride, tantalum aluminum nitride, lanthanum oxide, or combinations thereof. It should be appreciated that the compounds disclosed as metal gate materials may have varying stoichiometries. Accordingly, titanium nitride will be represented as $TiN_x$ herein, tantalum nitride will be represented as $TaN_x$ herein, and so on.

As defined herein, "high-k dielectric" materials correspond to: hafnium oxides (e.g., $HfO_2$); zirconium oxides (e.g., $ZrO_2$); hafnium oxysilicates; hafnium silicates; zirconium silicates; titanium silicates; aluminum oxides; lanthanum-doped analogous thereof (e.g., $LaAlO_3$); aluminum silicates; tantalates (e.g., $Ta_2O_5$); oxides and nitrides of hafnium and silicon (e.g., HfSiON); lanthanum-doped analogues thereof (e.g., HfSiON (La)); barium strontium titanate (BST); oxides of hafnium and aluminum (e.g., $Hf_xAl_yO_z$); strontium titanate ($SrTiO_3$); barium titanate ($BaTiO_3$); and combinations thereof.

As defined herein, "gate stack materials" correspond to: tantalum, tantalum nitride, titanium nitride, titanium, nickel, cobalt, tungsten, tungsten nitride, and silicides of the aforementioned metals; low-k dielectrics; polysilicon; poly-SiGe; silicon oxide; silicon nitride; BEOL layers; high-k replacement gates; hafnium oxides; hafnium oxysilicates; zirconium oxides; lanthanide oxides; titanates; nitrogen-doped analogues thereof; ruthenium; iridium; cadmium; lead; selenium; silver; MoTa; and combinations and salts thereof on the microelectronic device.

As defined herein, "amine" species include at least one primary amine, secondary amine, tertiary amine, and amine-N-oxides, with the proviso that ammonium-containing salts are not considered "amines" according to this definition. The amine formula can be represented by $NR^1R^2R^3$, wherein $R^1$, $R^2$ and $R^3$ can be the same as or different from one another and are selected from the group consisting of hydrogen, straight-chained or branched $C_1$-$C_6$ alkyls (e.g., methyl, ethyl, propyl, butyl, pentyl, hexyl), $C_6$-$C_{10}$ aryls (e.g., benzyl), straight-chained or branched $C_1$-$C_6$ alkanols (e.g., methanol, ethanol, propanol, butanol, pentanol, hexanol), and combinations thereof. As defined herein, "ammonium-containing salts" comprise the cation $[NR^1R^2R^3R^4]^+$, wherein $R^1$, $R^2$, $R^3$ and $R^4$ are the same as or different from one another and are selected from the group consisting of hydrogen, $C_1$-$C_6$ alkyls (e.g., methyl, ethyl, propyl, butyl, pentyl, hexyl), $C_1$-$C_6$ alkanols (e.g., methoxy, ethoxy, propoxy, butoxy, pentoxy, hexoxy), and $C_6$-$C_{10}$ aryls (e.g., benzyl).

As used herein, "about" is intended to correspond to ±5% of the stated value.

"Substantially devoid" is defined herein as less than 2 wt. %, preferably less than 1 wt. %, more preferably less than 0.5 wt. %, even more preferably less than 0.1 wt. %, and most preferably 0 wt. %.

As used herein, "selectively removing p-doped polysilicon relative to silicon nitride" corresponds to etch rate selectivity of about 2:1 to about 1000:1, preferably about 10:1 to about 300:1, and most preferably about 50:1 to about 200:1, wherein the ratio is based on thickness as a function of time. In other words, when the etch rate of the p-doped polysilicon is 2 nm min$^{-1}$ (or up to 1000 nm min$^{-1}$), the etch rate of the silicon nitride is at most 1 nm min$^{-1}$.

As used herein, the term "remove" corresponds to the selective removal of the p-doped, e.g., boron-doped, polysilicon from the substrate using the removal composition. It should be appreciated that the p-doped polysilicon, e.g., boron-doped polysilicon, is dissolved or otherwise solubilized in the removal composition, preferably dissolved. Further, it should be appreciated by the skilled artisan that the composition may include a negligible amount of the silicon nitride from the substrate dissolved or otherwise solubilized therein.

As used herein, "fluoride" species correspond to species including, but not limited to, an ionic fluoride ($F^-$) and $HF_2^-$ or a salt comprising same. It is to be appreciated that the fluoride species may be included as a fluoride species or generated in situ.

As used herein, "nitrate" species correspond to species including, but not limited to, nitric acid and its salts, preferably ammonium nitrate, or esters thereof.

As used herein, "silicon nitride" and "$Si_3N_4$" correspond to pure silicon nitride ($Si_3N_4$) as well as impure silicon nitride including hydrogen, carbon and/or oxygen impurities in the crystal structure.

As used herein, "polysilicon" or polycrystalline Si or poly-Si is understood by the person skilled in the art to be a polycrystalline form of silicon consisting of multiple small silicon crystals. It is typically deposited using low-pressure chemical vapor deposition (LPCVD) and is often doped n-type polysilicon or p-type polysilicon. The extent of doping can vary from lightly doped (e.g., in a range from $10^{13}$ cm$^{-3}$ to $10^{18}$ cm$^{-3}$) to heavily doped (e.g., greater than $10^{18}$ cm$^{-3}$), as readily understood by the person skilled in the art. Examples of p-doped material include polysilicon doped with a dopant species from Group IIIA of the Periodic Table, such as boron, aluminum, gallium and/or indium. An n-doped material may for example be polysilicon doped with a dopant species from Group IV (silicon, germanium, or tin) or Group V (phosphorus, arsenic, antimony, or bismuth) of the Periodic Table. The dummy polysilicon may be doped to provide p-doped and/or n-doped gate material, so that the resulting p-doped and/or n-doped material may be selectively removed.

Compositions of the invention may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.00001 weight percent, based on the total weight of the composition in which such components are employed.

In one aspect, a method of selectively removing p-doped polysilicon relative to silicon nitride from a substrate comprising same is described, said method comprising contacting a substrate comprising the p-doped polysilicon and silicon nitride with a removal composition, wherein the removal composition selectively removes the p-doped polysilicon relative to the silicon nitride. Preferably, the composition does not substantially remove other gate stack materials present on the substrate. In one embodiment, the p-doped polysilicon comprises boron. The substrate preferably comprises a high-k/metal gate integration scheme.

The method selectively removes p-doped polysilicon relative to silicon nitride at temperatures in a range from about 10° C. to about 75° C., preferably about 20° C. to about 50° C. It should be appreciated by the skilled artisan that the time of removal varies depending on whether the removal is performed in a single wafer tool or a multiple wafer tool, wherein time preferentially is in a range from about 30 seconds to about 4 minutes for the former and about 1 minute to about 20 minutes for the latter. Such contacting times and temperatures are illustrative, and any other suitable time and temperature conditions may be employed that are efficacious to selectively remove the p-doped polysilicon relative to silicon nitride from the substrate.

Preferably the removal rate of the p-doped polysilicon is in a range from about 50 nm min$^{-1}$ to about 500 nm min$^{-1}$, more preferably about 100 nm min$^{-1}$ to about 300 nm min$^{-1}$, and most preferably about 120 nm min$^{-1}$ to about 300 nm min$^{-1}$. The removal rate of the silicon nitride is lower than that of the p-doped polysilicon, e.g., boron-doped polysilicon, as described herein. For example, the removal rate of silicon nitride is preferably less than about 3 nm min$^{-1}$, more preferably less than about 2 nm min$^{-1}$, and most preferably less than about 1 nm mim$^{-1}$.

As introduced hereinabove, it is known that nitric acid/HF/water compositions can etch p-type polysilicon, but only at high nitric acid concentrations, wherein the high nitrogen content being disadvantageous. Surprisingly, the present inventors discovered that lowering the nitric acid concentration while adding sulfuric acid results in a removal composition that is capable of selectively removing p-doped polysilicon, e.g., boron-doped polysilicon, relative to silicon nitride, while still having a high etch rate of the p-doped polysilicon.

In a second aspect, a removal composition is described, said removal composition including at least one nitrate, at least one fluoride, at least one strong acid, optionally at least one silicon source, optionally at least one reducing agent, and optionally at least one solvent, for selectively removing p-doped polysilicon relative to silicon nitride. Preferably, the composition does not substantially remove other gate stack materials present on the substrate. In one embodiment, the removal compositions comprise, consist of, or consist essentially of at least one nitrate, at least one fluoride, and at least one strong acid. In another embodiment, the removal compositions comprise, consist of, or consist essentially of at least one nitrate, at least one fluoride, and at least one sulfur-containing strong acid. In yet another embodiment, the removal compositions comprise, consist of, or consist essentially of at least one nitrate, at least one fluoride, at least one strong acid, and at least one solvent. In still another embodiment, the removal compositions comprise, consist of, or consist essentially of at least one nitrate, at least one fluoride, at least one sulfur-containing strong acid, and at least one solvent. In another embodiment, the removal compositions comprise, consist of, or consist essentially of at least one nitrate, at least one fluoride, and at least one strong acid, wherein the removal composition is substantially devoid of added water. In another embodiment, the removal compositions comprise, consist of, or consist essentially of at least one nitrate, at least one fluoride, and at least one sulfur-containing strong acid, wherein the removal composition is substantially devoid of added water. In another embodiment, the removal compositions comprise, consist of, or consist essentially of at least one nitrate, at least one fluoride, at least one strong acid, and at least one silicon source or at least one reducing agent. In another embodiment, the removal compositions comprise, consist of, or consist essentially of at least one nitrate, at least one fluoride, at least one sulfur-containing strong acid, and at least one silicon source. In another embodiment, the removal compositions comprise, consist of, or consist essentially of at least one nitrate, at least one fluoride, at least one sulfur-containing strong acid, and at least one reducing agent. In another embodiment, the removal compositions comprise, consist of, or consist essentially of at least one nitrate, at least one fluoride, at least one strong acid, at least one silicon source or at least one reducing agent, and at least one solvent. In yet another embodiment, the removal compositions comprise, consist of, or consist essentially of at least one nitrate, at least one fluoride, at least one sulfur-containing acid, at least one silicon source, and at least one solvent. In another embodiment, the removal compositions comprise, consist of, or consist essentially of at least one nitrate, at least one fluoride, at least one sulfur-containing acid, at least one reducing agent, and at least one solvent. In still another embodiment, the removal compositions comprise, consist of, or consist essentially of at least one nitrate, at least one fluoride, at least one strong acid, and at least one silicon source or at least one reducing agent, wherein the removal composition is substantially devoid of added water. In still another embodiment, the removal compositions comprise, consist of, or consist essentially of at least one nitrate, at least one fluoride, at least one strong acid, at least one silicon source or at least one reducing agent, and at least one solvent. In still another embodiment, the removal compositions comprise, consist of, or consist essentially of at least one nitrate, at least one fluoride, at least one sulfur-containing strong acid, and at least one silicon source, wherein the removal composition is substantially devoid of added water. In yet another embodiment, the removal compositions comprise, consist of, or consist essentially of at least one nitrate, at least one fluoride, at least one sulfur-containing strong acid, at least one silicon source, and at least one solvent. In yet another embodiment, the removal compositions comprise, consist of, or consist essentially of at least one nitrate, at least one fluoride, at least one sulfur-containing strong acid, and at least one reducing agent, wherein the removal composition is substantially devoid of added water. In another embodiment, the removal compositions comprise, consist of, or consist essentially of at least one nitrate, at least one fluoride, at least one sulfur-containing strong acid, at least one reducing agent, and at least one solvent. In still another embodiment, the removal compositions comprise, consist of, or consist essentially of at least one nitrate, at least one fluoride, at least one strong acid, at least one silicon source, at least one reducing agent, and at least one solvent.

In a preferred embodiment of the invention, the removal composition is substantially devoid of $XeF_2$, amines, chlorides ($Cl^-$), metal halides, chelating agents (e.g., Iminodiacetic acid, Malonic acid, Oxalic acid, Succinic acid, Boric acid, Malic acid, 2,4-Pentanedione, and/or glycol ether chelating agents), and combinations thereof. The pH (or the Hammett acidity function $H_0$) of the removal composition of the second aspect is preferably less than 2, preferably in a range from 2 to about −8, more preferably from −1 to about −5.

The at least one solvent can comprise water and/or at least one water-miscible organic solvent selected from the group consisting of methanol, ethanol, isopropanol, butanol, pentanol, hexanol, 2-ethyl-1-hexanol, heptanol, octanol, ethylene glycol, propylene glycol, butylene glycol, butylene carbonate, ethylene carbonate, propylene carbonate, dipropylene glycol, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether, triethylene glycol monobutyl ether, ethylene glycol monohexyl ether, diethylene glycol monohexyl ether, ethylene glycol phenyl ether, propylene glycol methyl ether, dipropylene glycol methyl ether (DPGME), tripropylene glycol methyl ether (TPGME), dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, 2,3-dihydrodecafluoropentane, ethyl perfluorobutylether, methyl perfluorobutylether, alkyl carbonates, alkylene carbonates, 4-methyl-2-pentanol, dimethylsulfoxide, sulfolane, methylsulfonylmethane, acetic acid, acetic anhydride, trifluoroacetic acid, dense fluid, and combinations thereof. Preferably, the at least one solvent comprises water, sulfolane, methylsulfonylmethane, and any combination thereof.

The at least one fluoride source includes, but is not limited to, hydrofluoric acid, ammonium fluoride, ammonium bifluoride, hexafluorosilicic acid, tetrafluoroboric acid, tetrabutylammonium tetrafluoroborate (TBA-$BF_4$), hexafluorotantalic acid, hexafluorotitanic acid, ammonium hexafluorotantalate, tetraalkylammonium fluorides having the formula [$NR^1R^2R^3R^4$]F, wherein $R^1$, $R^2$, $R^3$ and $R^4$ are the same as or different from one another and are selected from the group consisting of $C_1$-$C_6$ alkyls (e.g., methyl, ethyl, propyl, butyl, pentyl, hexyl) and $C_6$-$C_{10}$ aryls (e.g., benzyl), such as tetramethylammonium fluoride, or a combination thereof. Preferably, the at least one fluoride comprises HF.

Nitrates contemplated herein include, but are not limited to, nitric acid, sodium nitrate, potassium nitrate, rubidium nitrate, magnesium nitrate, calcium nitrate, ammonium nitrate, tetraalkylammonium nitrates having the formula [$NR^1R^2R^3R^4$]$NO_3$, wherein $R^1$, $R^2$, $R^3$ and $R^4$ are the same as or different from one another and are selected from the group consisting of $C_1$-$C_6$ alkyls (e.g., methyl, ethyl, propyl, butyl, pentyl, hexyl) and $C_6$-$C_{10}$ aryls (e.g., benzyl), such as tetramethylammonium nitrate, and combinations thereof. Preferably, the at least one nitrate comprises nitric acid.

The at least one strong acid includes, but is not limited to, sulfuric acid, alkanesulfonic acids (e.g., methanesulfonic acid (MSA), ethanesulfonic acid, 2-hydroxyethanesulfonic acid, n-propanesulfonic acid, isopropanesulfonic acid, isobutenesulfonic acid, n-butanesulfonic acid, n-octanesulfonic acid), trifluoromethanesulfonic acid, p-toluenesulfonic acid, tetrafluoroboric acid, perchloric acid, and combinations thereof. Preferably, the at least one strong acid comprises a sulfur-containing acid such as sulfuric acid.

Although not wishing to be bound by theory, it is thought that the source of silicon stabilizes the etch rate of the p-doped polysilicon. The silicon source can be added to the removal composition as a silicon powder, or as a silane, or a combination of both. Silanes include, but are not limited to, tetramethylorthosilicate (TMOS), tetraethylorthosilicate (TEOS), 3-aminopropyltrimethoxysilane, bis[3-(trimethoxysilyl)propyl]-ethylenediamine, bis[3-(triethoxysilyl)propyl]-ethylenediamine, methyltrimethoxysilane (MTMS), polydimethylsilane (PDMS), propyltrimethoxysilane (PTMS), methyltriethoxysilane (MTES), ethyltriethoxysilane, triethoxysilane, trimethoxysilane, dimethyldiethoxysilane, diethyldiethoxysilane, diethyldimethoxysilane, bis(3-trimethoxysilylpropyl)-N-methylamine, 3-(2-Aminoethylamino)propyltriethoxysilane, N-propyltriethoxysilane, 3-(2-Aminoethylamino)propyltrimethoxysilane, methylcyclohexyldimethoxysilane, dimethyldimethoxysilane, dicyclopentyldimethoxysilane, 3-[2(vinyl benzylamino)ethylamino]propyltrimethoxysilane, 3-aminopropyltriethoxysilane, 3-(aminopropyl)dimethylethoxysilane, 3-(aminopropyl)methyldiethoxysilane, 3-(aminopropyl)methyldimethoxysilane, 3-(aminopropyl)dimethylmethoxysilane, N-butyl-3-aminopropyltriethoxysilane, N-butyl-3-aminopropyltrimethoxysilane, N-(β-aminoethyl)-γ-amino-propyltriethoxysilane, 4-aminobutyldimethylethoxysilane, N-(2-Aminoethyl)-3-aminopropylmethyldimethoxysilane, N-(2-Aminoethyl)-3-aminopropylmethyldiethoxysilane, 3-aminopropylmethyldiethoxysilane, 1,1,3,3-tetramethyldisiloxane, 1,1,3,3-tetramethyldisilazane, (N,N-dimethylamino)dimethylsilane, or combinations thereof. Alternatively, or in addition to, the silicon source can be a quaternary ammonium silicate, such as tetraalkyl ammonium silicate. The silicon source(s) is preferably dissolved in the removal composition. Preferably, the source of silicon comprises silicon powder.

Although not wishing to be bound by theory, it is thought that another stabilization mechanism of the etch rate involves the presence of reduced nitrogen species, such as nitric oxide, nitrous acid and nitrogen dioxide, possibly in cationic form. Such species may be formed in situ by the reaction of at least one nitrate, e.g., nitric acid, with the source of silicon. The silicon source can be added to the removal composition as a silicon powder, or as a silane, or a combination of both. Silanes include, but are not limited to, triethoxysilane, trimethoxysilane, tetramethylorthosilicate (TMOS), tetraethylorthosilicate (TEOS), 3-aminopropyltrimethoxysilane, bis[3-(trimethoxysilyl)propyl]-ethylenediamine, bis[3-(triethoxysilyl)propyl]-ethylenediamine, methyltrimethoxysilane (MTMS), polydimethylsilane (PDMS), propyltrimethoxysilane (PTMS), methyltriethoxysilane (MTES), ethyltriethoxysilane, triethoxysilane, trimethoxysilane, dimethyldiethoxysilane, diethyldiethoxysilane, diethyldimethoxysilane, bis(3-trimethoxysilylpropyl)-N-methylamine, 3-(2-Aminoethylamino)propyltriethoxysilane, N-propyltriethoxysilane, 3-(2-Aminoethylamino)propyltrimethoxysilane, methylcyclohexyldimethoxysilane, dimethyldimethoxysilane, dicyclopentyldimethoxysilane, 3-[2(vinyl benzylamino)ethylamino]propyltrimethoxysilane, 3-aminopropyltriethoxysilane, 3-(aminopropyl)dimethylethoxysilane, 3-(aminopropyl)methyldiethoxysilane, 3-(aminopropyl)methyldimethoxysilane, 3-(aminopropyl)dimethylmethoxysilane, N-butyl-3-aminopropyltriethoxysilane, N-butyl-3-aminopropyltrimethoxysilane, N-(β-amimoethyl)-γ-aminopropyltriethoxysilane, 4-amino-butyldimethyl ethoxysilane, N-(2-Aminoethyl)-3-aminopropylmethyldimethoxysilane, N-(2-Aminoethyl)-3-aminopropylmethyldiethoxysilane, 3-aminopropylmethyldiethoxysilane, 1,1,3,3-tetramethyldisiloxane, 1,1,3,3-tetramethyldisilazane, (N,N-dimethylamino)dimethylsilane, or combinations thereof. Alternatively, or in addition to, the silicon source can be a quaternary ammonium silicate, such as tetraalkyl ammonium silicate. The silicon source(s) is preferably dissolved in the removal composition. Preferably, the source of silicon comprises silicon powder.

Some of the at least one nitrate, e.g., nitric acid, can also be reduced using at least one reducing agent. For example, the reduction can be performed by addition of a sulfur dioxide solution, a sulfite salt (e.g., ammonium hydrogen sulfite) or a thiosulfate salt (e.g., ammonium thiosulfate), or elemental sulfur. Other reducing agents include, but are not limited to, dimethyl sulfoxide, formic acid and formaldehyde (oxidized to $CO_2$), glyoxylic acid or glyoxal (oxidized to oxalic acid), hydrazine sulfate, hydroxylamine sulfate, boroxine ($H_3B_3O_3$, oxidized to boric acid), borane-amine or borane-ammonia complexes, tetramethylammonium borohydride, sulfurous acid, or potassium borohydride. Preferably, sulfurous acid is used as the reducing agent to generate the reduced nitrogen species. Another option that doesn't involve additives is electrochemical reduction of the at least one nitrate to a reduced nitrogen species.

It should be appreciated that the reduced nitrogen species may be part of the formulation as additives, with nitrous acid in particular being most conveniently added in the form of a nitrite salt such as potassium nitrite, dicyclohexylamine nitrite, or tetrabutylammonium nitrite. Other compounds that can directly add a reduced nitrogen species to the removal composition include nitrosylsulfonic acid, nitrosyl tetrafluoroborate, as well as nitric oxide (NO), nitrogen dioxide ($NO_2$), or a mixture thereof. Preferably, the gases are bubbled through the removal composition. The foregoing reduced nitrogen species would be added in place of, or in addition to, the at least one nitrate described herein Notably, hydrofluoric acid, sulfuric acid, and nitric acid are typically shipped with residual quantities of water and as such, water may be present in the removal composition in addition to any water intentionally added to the combination of the chemicals. Alternatively, gaseous anhydrous hydrogen fluoride and/or fuming nitric acid (100%) may be used, wherein additional water or other solvent(s) can be added.

As understood by the person skilled in the art, naturally present water (e.g., in concentrated sulfuric acid, concentrated nitric acid, concentrated HF, etc.) is not considered "added water."

In a preferred embodiment, the removal composition of the second aspect comprises, consists of, or consists essentially of:

|  | preferably | more preferably |
|---|---|---|
| nitrate(s) | about 0.1 to about 1 wt % | about 0.1 to about 1 wt % |
| fluoride(s) | about 0.1 wt % to about 3 wt % | about 0.1 wt % to about 3 wt % |
| strong acid(s) | about 50 wt % to about 85 wt % | about 60 wt % to about 80 wt % |
| solvent(s) | about 11 wt % to about 49.8 wt % | about 16 wt % to about 39.8 wt % |

In another preferred embodiment, the removal composition of the second aspect comprises, consists of, or consists essentially of:

|  | preferably | more preferably |
|---|---|---|
| nitric acid (conc) | about 0.1 to about 1 wt % | about 0.1 to about 1 wt % |
| HF (conc) | about 0.1 wt % to about 3 wt % | about 0.1 wt % to about 3 wt % |
| sulfuric acid (conc) | about 50 wt % to about 85 wt % | about 60 wt % to about 80 wt % |
| solvent(s) | about 11 wt % to about 49.8 wt % | about 16 wt % to about 39.8 wt % |

In still another preferred embodiment, the removal composition of the second aspect comprises, consists of, or consists essentially of:

|  | preferably | more preferably |
|---|---|---|
| nitrate(s) | about 0.1 to about 1 wt % | about 0.1 to about 1 wt % |
| fluoride(s) | about 0.1 wt % to about 3 wt % | about 0.1 wt % to about 3 wt % |
| strong acid(s) | about 50 wt % to about 85 wt % | about 60 wt % to about 80 wt % |
| silicon source(s) and/or reducing agent(s) | about 0.00001 wt % to about 0.005 wt % | about 0.00001 wt % to about 0.002 wt % |
| solvent(s) | about 11 wt % to about 49.8 wt % | about 16 wt % to about 39.8 wt % |

In yet another preferred embodiment, the removal composition of the second aspect comprises, consists of, or consists essentially of:

|  | preferably | more preferably |
|---|---|---|
| nitric acid (conc) | about 0.1 to about 1 wt % | about 0.1 to about 1 wt % |
| HF (conc) | about 0.1 wt % to about 3 wt % | about 0.1 wt % to about 3 wt % |
| sulfuric acid (conc) | about 50 wt % to about 85 wt % | about 60 wt % to about 80 wt % |
| silicon source(s) and/or reducing agent(s) | about 0.00001 wt % to about 0.005 wt % | about 0.00001 wt % to about 0.002 wt % |
| solvent(s) | about 11 wt % to about 49.8 wt % | about 16 wt % to about 39.8 wt % |

In still another preferred embodiment, the removal composition of the second aspect comprises, consists of, or consists essentially of:

|  | preferably | more preferably |
|---|---|---|
| nitrate(s) | about 0.1 to about 1 wt % | about 0.1 to about 1 wt % |
| fluoride(s) | about 0.1 wt % to about 3 wt % | about 0.1 wt % to about 3 wt % |
| strong acid(s) | about 50 wt % to about 85 wt % | about 60 wt % to about 80 wt % |
| silicon source(s) and/or reducing agent(s) | about 0.00001 wt % to about 0.5 wt % | about 0.00001 wt % to about 0.3 wt % |
| solvent(s) | about 10.5 wt % to about 49.8 wt % | about 15.7 wt % to about 39.8 wt % |

In yet another preferred embodiment, the removal composition of the second aspect comprises, consists of, or consists essentially of:

|  | preferably | more preferably |
|---|---|---|
| nitric acid (conc) | about 0.1 to about 1 wt % | about 0.1 to about 1 wt % |
| HF (conc) | about 0.1 wt % to about 3 wt % | about 0.1 wt % to about 3 wt % |
| sulfuric acid (conc) | about 50 wt % to about 85 wt % | about 60 wt % to about 80 wt % |
| silicon source(s) and/or reducing agent(s) | about 0.00001 wt % to about 0.5 wt % | about 0.00001 wt % to about 0.3 wt % |
| solvent(s) | about 10.5 wt % to about 49.8 wt % | about 15.7 wt % to about 39.8 wt % |

Advantageously, the removal compositions described herein are capable of etching p-doped polysilicon (e.g., boron-doped polysilicon) at high etch rates while simultaneously being compatible with silicon nitride (i.e., there is a low etch rate of silicon nitride). Moreover, the process temperatures are moderate, the removal composition is water soluble, the cost of composition preparation is low, and the waste is low because of the low phosphorus and nitrogen content in the removal composition.

Although not wishing to be bound by theory, it is thought that the selectivity of p-doped polysilicon relative to silicon nitride is affected by the weight percent ratio of nitrate(s) to fluoride(s). Initial results suggest that a weight percent ratio of 70% nitric acid to 49% HF in a range from about 0.2:1 to about 2:1, preferably about 0.3:1 to about 1:1 resulted in the best selectivity of p-doped polysilicon (e.g., boron-doped polysilicon) relative to silicon nitride (greater than 50:1 selectivity). Further, initial results suggest that there may be an optimal weight percent of sulfur-containing acid(s), e.g., sulfuric acid, present, for example, in a range from about 60 wt % to about 70 wt % of concentrated sulfuric acid resulted in the best selectivity of p-doped polysilicon (e.g., boron-doped polysilicon) relative to silicon nitride (greater than 50:1 selectivity). In addition, it was discovered that adding at least one silicon source or at least one reducing agent catalyzed the etch rate of the p-doped polysilicon as well as provided a stable etch rate of same.

In another aspect of the present invention, the removal compositions described herein may further include dissolved p-doped polysilicon, e.g., boron-doped polysilicon. For example, the removal compositions may comprise, consist essentially of, or consist of at least one nitrate, at least one fluoride, at least one strong acid, optionally at least one silicon source or at least one reducing agent, and optionally at least one solvent.

It will be appreciated that it is common practice to make concentrated forms of the removal compositions to be diluted prior to use. For example, the removal composition may be manufactured in a more concentrated form, including at least one nitrate, at least one fluoride, at least one strong acid, optionally at least one silicon source, optionally at least one reducing agent, and optionally at least one solvent, and thereafter diluted with solvent and/or the additional strong acid at the manufacturer, before use, and/or during use at the fab. Dilution ratios may be in a range from about 0.1 part diluent:1 part removal composition concentrate to about 100 parts diluent:1 part removal composition concentrate.

It is further appreciated that the limitations of the system used for dispensing or processing the mixture at the time of use may require modification of the rheological profile to reduce the viscosity of the mixture. To this end, the use of surfactants, polymers, or the like can reduce the viscosity or overall rheological profile (i.e., Newtonian to non-Newtonian) to improve the processing capability of the mixture. There is the potential added benefit of using the removal composition in high aspect ratio features and well as improving the rinsing properties after processing.

The removal compositions of the invention are easily formulated by simple addition of the respective ingredients and mixing to homogeneous condition. Furthermore, the removal compositions may be readily formulated as single-package formulations or multi-part formulations that are mixed at or before the point of use, preferably multi-part formulations. The individual parts of the multi-part formulation may be mixed at the tool or in a mixing region/area such as an inline mixer or in a storage tank upstream of the tool. It is contemplated that the various parts of the multi-part formulation may contain any combination of ingredients/constituents that when mixed together form the desired removal composition. The concentrations of the respective ingredients may be widely varied in specific multiples of the removal composition, i.e., more dilute or more concentrated, in the broad practice of the invention, and it will be appreciated that the removal compositions of the invention can variously and alternatively comprise, consist or consist essentially of any combination of ingredients consistent with the disclosure herein.

Accordingly, another aspect of the invention relates to a kit including, in one or more containers, one or more components adapted to form the compositions of the invention. Preferably, the kit includes, in one or more containers, at least one nitrate, at least one fluoride, at least one strong acid, optionally at least one silicon source, optionally at least one reducing agent, and optionally at least one solvent, for combining with solvent and/or additional strong acid at the fab or the point of use. The containers of the kit must be suitable for storing and shipping said removal compositions, for example, NOWPak® containers (Advanced Technology Materials, Inc., Danbury, Conn., USA). The one or more containers which contain the components of the removal composition preferably include means for bringing the components in said one or more containers in fluid communication for blending and dispense. For example, referring to the NOWPak® containers, gas pressure may be applied to the outside of a liner in said one or more containers to cause at least a portion of the contents of the liner to be discharged and hence enable fluid communication for blending and dispense. Alternatively, gas pressure may be applied to the head space of a conventional pressurizable container or a pump may be used to enable fluid communication. In addition, the system preferably includes a dispensing port for dispensing the blended removal composition to a process tool.

Substantially chemically inert, impurity-free, flexible and resilient polymeric film materials, such as high density polyethylene, are preferably used to fabricate the liners for said one or more containers. Desirable liner materials are processed without requiring co-extrusion or barrier layers, and without any pigments, UV inhibitors, or processing agents that may adversely affect the purity requirements for components to be disposed in the liner. A listing of desirable liner materials include films comprising virgin (additive-free) polyethylene, virgin polytetrafluoroethylene (PTFE), polypropylene, polyurethane, polyvinylidene chloride, polyvinylchloride, polyacetal, polystyrene, polyacrylonitrile, polybutylene, and so on. Preferred thicknesses of such liner materials are in a range from about 5 mils (0.005 inch) to about 30 mils (0.030 inch), as for example a thickness of 20 mils (0.020 inch).

Regarding the containers for the kits, the disclosures of the following patents and patent applications are hereby incorporated herein by reference in their respective entireties: U.S. Pat. No. 7,188,644 entitled "APPARATUS AND METHOD FOR MINIMIZING THE GENERATION OF PARTICLES IN ULTRAPURE LIQUIDS;" U.S. Pat. No. 6,698,619 entitled "RETURNABLE AND REUSABLE, BAG-IN-DRUM FLUID STORAGE AND DISPENSING CONTAINER SYSTEM;" and U.S. patent application Ser. No. 12/599,291 entitled "SYSTEMS AND METHODS FOR MATERIAL BLENDING AND DISTRIBUTION" filed on Nov. 24, 2009 in the name of John E. Q. Hughes.

As applied to microelectronic manufacturing operations, the removal compositions described herein are usefully employed to selectively remove p-doped polysilicon (e.g., boron-doped polysilicon) relative to silicon nitride from the surface of the microelectronic device, and may be applied to said surface before or after the application of other compositions formulated to remove alternative materials from the surface of the device. Importantly, the removal compositions described herein selectively remove p-doped polysilicon (e.g., boron-doped polysilicon) relative to silicon nitride while not substantially removing other metal stack materials present on the substrate.

In removal application, the removal composition is applied in any suitable manner to the device, e.g., by spraying the removal composition on the surface of the device, by dipping the device in a static or dynamic volume of the removal composition, by contacting the device with another material, e.g., a pad, or fibrous sorbent applicator element, that has the removal composition absorbed thereon, or by any other suitable means, manner or technique by which the removal composition is brought into removal contact with the device having the p-doped polysilicon and the silicon nitride. Further, batch or single wafer processing is contemplated herein.

Following the achievement of the desired removal action, the removal composition is readily removed from the device to which it has previously been applied, e.g., by rinse, wash, or other removal step(s), as may be desired and efficacious. For example, the device may be rinsed with a rinse solution including deionized water and/or dried (e.g., spin-dry, $N_2$, solvents (such as IPA) vapor-dry etc.). Optionally a small amount of a basic reagent such as ammonia may be added to the rinse water, so as to bring its pH to about 10. This modification is thought to be useful for preventing sulfate contamination of silicon-based surfaces treated in high-concentration sulfuric acid solutions.

Another aspect of the invention relates to the improved microelectronic devices made according to the methods of the invention and to products containing such microelectronic devices.

A still further aspect of the invention relates to methods of manufacturing an article comprising a microelectronic device, said method comprising contacting the microelectronic device with a removal composition for sufficient time to selectively remove p-doped polysilicon (e.g., boron-doped polysilicon) relative to silicon nitride from the microelectronic device having said material thereon, and incorporating said microelectronic device into said article. The removal composition can comprise, consist of, or consist essentially of at least one nitrate, at least one fluoride, at least one strong acid, optionally at least one silicon source or at least one reducing agent, and optionally at least one solvent.

Another aspect of the invention relates to an article of manufacture, said article comprising a microelectronic device substrate and a removal composition, wherein the microelectronic device substrate comprises p-doped polysilicon (e.g., boron-doped polysilicon) and silicon nitride. For example, the removal composition can comprise at least one nitrate, at least one fluoride, at least one strong acid, optionally at least one silicon source or at least one reducing agent, and optionally at least one solvent.

In another aspect, the disclosure relates to a method of fabricating a semiconductor device, comprising carrying out a gate last process including forming a dummy gate of p-doped polysilicon, and thereafter removing the dummy gate for replacement by a metal gate, wherein the dummy gate is removed by a removal composition described herein.

It should be appreciated by the person skilled in the art that the removal compositions described herein are not limited to the selective removal of p-doped polysilicon relative to silicon nitride, but can be used to remove silicon-containing materials in general, for example, sacrificial polysilicon (doped or undoped) and crystalline silicon, as understood by the person skilled in the art.

The features and advantages of the invention are more fully shown by the illustrative examples discussed below.

EXAMPLE 1

Examples of sample formulations are shown in Table 1 below.

TABLE 1

Formulations A-D

| Component | Formulation/wt % | | | |
|---|---|---|---|---|
| | A | B | C | D |
| $H_2SO_4$ (conc) | 61.31 | 61.45 | 61.39 | 63.19 |
| $HNO_3$ (70%) | 0.23 | 0.25 | 0.25 | 0.25 |
| HF (49%) | 0.38 | 0.5 | 0.64 | 0.64 |
| DIW | 38.06 | 37.57 | 37.5 | 35.7 |
| Si | 0.02 | 0 | 0 | 0 |
| $H_2SO_3$ | 0 | 0.24 | 0.2 | 0.2 |
| HCOOH | 0 | 0 | 0.02 | 0.02 |

Performance of formulations A-D are shown below in Table 2. Etch rates were measured on a spinning wafer at 400 RPM. Accelerated shelf life tests were executed at 55° C. for times ranging up to 37.4 days. The times shown in Table 2 are for predicted aging behavior at 20° C. and include an estimated 10× acceleration factor.

TABLE 2

Experimental results of Formulations A-D

| Performance Metric | A | B | C | D |
|---|---|---|---|---|
| B-doped poly-Si etch rate (nm/minute) | 120 | 300 | 366 | 346 |
| LPCVD SiN Etch Rate (nm/minute) | 0.78 | 1.2 | 1.31 | 1.2 |
| B-doped poly-Si/Si$_3$N$_4$ Selectivity | 154 | 250 | 279 | 288 |
| Etch Rate stability | stable | stable | stable | stable |
| Process Temp | 40° C. | 35° C. | 35° C. | 35° C. |
| Shelf life | 45% B-doped poly-Si etch rate (ER) loss in 80 days | 270 nm/min @374 days | 332 nm/min @374 days | 302 nm/min @374 days |
| Open Bath Life | 98.4% B-doped poly-Si ER loss in 24 H | 66% B-doped poly-Si ER loss in 24 H | 33% B-doped poly-Si ER loss in 24 H @35° C. | 13% B-doped poly-Si ER loss in 24 H @35° C. |
| Viscosity @ process T | 4.1 | 4.5 | 4.5 | 5.0 |

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art, based on the disclosure herein. The invention therefore is to be broadly construed, as encompassing all such variations, modifications and alternative embodiments within the spirit and scope of the claims hereafter set forth.

What is claimed is:

1. A method of selectively removing p-doped polysilicon relative to silicon nitride, said method comprising contacting a substrate comprising p-doped polysilicon and silicon nitride with a removal composition, wherein the removal composition selectively removes the p-doped polysilicon relative to silicon nitride and comprises about 0.1 wt % to about 1 wt % of at least one nitrate, about 0.1 wt % to about 3 wt % of at least one fluoride, about 50 wt % to about 85 wt % of at least one strong acid, about 0.00001 wt % to about 0.5 wt % of at least one silicon source and at least one reducing agent, and about 10.5 wt % to about 49.8 wt % of at least one solvent, wherein the removal composition has a ratio of at least one nitrate to at least one fluoride in a range of from about 0.2:1 to about 2:1 and a pH of from 2 to about −8, and wherein the at least one reducing agent comprises a species selected from the group consisting of a sulfur dioxide solution, a sulfite salt, a thiosulfate salt, sulfurous acid, elemental sulfur, dimethyl sulfoxide, formic acid, formaldehyde, glyoxylic acid, glyoxal, hydrazine sulfate, hydroxylamine sulfate, boroxine, borane-amine complexes, borane-ammonia complexes, tetramethylammonium borohydride, potassium borohydride, and combinations thereof.

2. The method of claim 1, wherein the removal composition does not substantially remove other gate stack materials present on the substrate.

3. The method of claim 1, wherein the at least one fluoride comprises a species selected from the group consisting of hydrofluoric acid, ammonium fluoride, ammonium bifluoride, hexafluorosilicic acid, tetrafluoroboric acid, tetrabutylammonium tetrafluoroborate (TBA-BF$_4$), hexafluorotantalic acid, hexafluorotitanic acid, ammonium hexafluorotantalate, tetraalkylammonium fluorides having the formula [NR$^1$R$^2$R$^3$R$^4$]F, wherein R$^1$, R$^2$, R$^3$ and R$^4$ are the same as or different from one another and are selected from the group consisting of C$_1$-C$_6$ alkyls and C$_6$-C$_{10}$ aryls, and a combination thereof.

4. The method of claim 1, wherein the at least one nitrate comprises a species selected from the group consisting of nitric acid, sodium nitrate, potassium nitrate, rubidium nitrate, magnesium nitrate, calcium nitrate, ammonium nitrate, tetraalkylammonium nitrates having the formula [NR$^1$R$^2$R$^3$R$^4$]NO$_3$, wherein R$^1$, R$^2$, R$^3$ and R$^4$ are the same as or different from one another and are selected from the group consisting of C$_1$-C$_6$ alkyls and C$_6$-C$_{10}$ aryls, and combinations thereof.

5. The method of claim 1, wherein the at least one solvent comprises a species selected from the group consisting of water, methanol, ethanol, isopropanol, butanol, pentanol, hexanol, 2-ethyl-1-hexanol, heptanol, octanol, ethylene glycol, propylene glycol, butylene glycol, butylene carbonate, ethylene carbonate, propylene carbonate, dipropylene glycol, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether, triethylene glycol monobutyl ether, ethylene glycol monohexyl ether, diethylene glycol monohexyl ether, ethylene glycol phenyl ether, propylene glycol methyl ether, dipropylene glycol methyl ether (DPGME), tripropylene glycol methyl ether (TPGME), dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, 2,3-dihydrodecafluoropentane, ethyl perfluorobutylether, methyl perfluorobutylether, alkyl carbonates, alkylene carbonates, 4-methyl-2-pentanol, acetic acid, acetic anhydride, trifluoroacetic acid, dim ethyl sulfoxide, sulfolane, methyl sulfonylmethane, dense fluid, and combinations thereof.

6. The method of claim 1, wherein the at least one strong acid comprises a species selected from the group consisting of sulfuric acid, methanesulfonic acid (MSA), ethanesulfonic acid, 2-hydroxyethanesulfonic acid, n-propanesulfonic acid, isopropanesulfonic acid, isobutenesulfonic acid, n-butanesulfonic acid, n-octanesulfonic acid, trifluoromethanesulfonic acid, p-toluenesulfonic acid, tetrafluoroboric acid, perchloric acid, and combinations thereof.

7. The method of claim 1, wherein the at least one silicon source is selected from the group consisting of silicon powder, tetramethylorthosilicate (TMOS), tetraethylorthosilicate (TEOS), 3-aminopropyltrimethoxysilane, bis [3-(trimethoxysilyl)propyl]-ethylenediamine, bis [3-(triethoxysilyl)propyl]-ethylenediamine, methyltrimethoxysilane (MTMS), polydimethylsilane (PDMS), propyltrimethoxysilane (PTMS), methyltriethoxysilane (MTES), ethyltriethoxysilane, triethoxysilane, trimethoxysilane, dimethyldiethoxysilane, diethyldiethoxysilane, diethyldimethoxysilane, bis (3-trimethoxysilylpropyl)-N-methylamine, 3-(2-Aminoethylamino)propyltriethoxysilane, N-propyltriethoxysilane, 3-(2-Aminoethylamino)propyltrimethoxysilane, methylcyclohexyldimethoxysilane, dimethyldimethoxysilane, dicyclopentyldimethoxysilane, 3-[2 (vinyl benzylamino)ethylamino]propyltrimethoxysilane, 3-aminopropyltriethoxysilane, 3-(aminopropyl)dimethylethoxysilane, 3-(aminopropyl)methyldiethoxysilane, 3-(aminopropyl)methyldimethoxysilane, 3-(aminopropyl)

dimethylmethoxysilane, N-butyl-3-aminopropyltriethoxysilane, N-butyl-3-aminopropyltrimethoxysilane, N-(β-aminoethyl)-γ-amino-propyltriethoxysilane, 4-aminobutyldimethyl ethoxysilane, N-(2-Aminoethyl)-3-aminopropylmethyldimethoxysilane, N-(2-Aminoethyl)-3-aminopropylmethyldiethoxysilane, 3-aminopropylmethyldiethoxysilane, 1,1,3,3-tetramethyldisiloxane, 1,1,3,3-tetramethyldisilazane, (N,N-dimethylamino)dimethylsilane, tetraalkyl ammonium silicate, and combinations thereof.

8. The method of claim 1, wherein the removal composition is substantially devoid of $XeF_2$, amines, chlorides ($Cl^-$), metal halides, Iminodiacetic acid, Malonic acid, Oxalic acid, Succinic acid, Boric acid, Malic acid, 2,4-Pentanedione, glycol ether chelating agents, or combinations thereof.

9. The method of claim 1, wherein the pH of the removal composition is in a range from −1 to about −5.

10. The method of claim 1, wherein the removal composition further comprises dissolved p-doped polysilicon.

11. The method of claim 1, wherein the removal composition is rinsed from the device with a rinse solution.

12. The method of claim 1, wherein the at least one fluoride comprises HF.

13. The method of claim 1, wherein the at least one nitrate comprises nitric acid.

14. The method of claim 1, wherein the at least one solvent comprises water, sulfolane, methylsulfonylmethane, or combinations thereof.

15. The method of claim 1, wherein the at least one strong acid comprises sulfuric acid.

16. The method of claim 1, wherein the ratio of at least one nitrate to at least one fluoride is in a range of from about 0.3:1 to about 1:1.

17. A method of selectively removing p-doped polysilicon relative to silicon nitride, said method comprising contacting a substrate comprising p-doped polysilicon and silicon nitride with a removal composition, wherein the removal composition selectively removes the p-doped polysilicon relative to silicon nitride and comprises about 0.1 wt % to about 1 wt % of at least one nitrate about 0.1 wt % to about 3 wt % of at least one fluoride, about 50 wt % to about 85 wt % of at least one strong acid, about 0.00001 wt % to about 0.5 wt % of at least one silicon source or at least one reducing agent, and about 10.5 wt % to about 49.8 wt % of at least one solvent, wherein the removal composition has a ratio of at least one nitrate to at least one fluoride in a range of from about 0.2:1 to about 2:1 and a pH of from 2 to about −8, and wherein the at least one reducing agent comprises a species selected from the group consisting of a sulfur dioxide solution, a sulfite salt, a thiosulfate salt, sulfurous acid, elemental sulfur, dimethyl sulfoxide, formic acid, formaldehyde, glyoxylic acid, glyoxal, hydrazine sulfate, hydroxylamine sulfate, boroxine, borane-amine complexes, borane-ammonia complexes, tetramethylammonium borohydride, potassium borohydride, and combinations thereof, wherein the substrate comprising p-doped polysilicon and silicon nitride is contacted with the removal composition at a temperature in a range of from about 10° C. to about 75° C.

* * * * *